US012660524B2

(12) United States Patent
Ueda et al.

(10) Patent No.: US 12,660,524 B2
(45) Date of Patent: Jun. 16, 2026

(54) METHOD OF MANUFACTURING SEMICONDUCTOR DEVICE, METHOD OF PROCESSING SUBSTRATE, RECORDING MEDIUM, AND SUBSTRATE PROCESSING APPARATUS

(71) Applicant: KOKUSAI ELECTRIC CORPORATION, Tokyo (JP)

(72) Inventors: Tatsushi Ueda, Toyama (JP); Masanori Nakayama, Toyama (JP); Katsunori Funaki, Toyama (JP); Yasutoshi Tsubota, Toyama (JP); Hiroto Igawa, Toyama (JP); Yuki Yamakado, Toyama (JP); Hiroki Kishimoto, Toyama (JP); Yuichiro Takeshima, Toyama (JP); Keita Ichimura, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 980 days.

(21) Appl. No.: 17/674,297

(22) Filed: Feb. 17, 2022

(65) Prior Publication Data

US 2022/0301863 A1 Sep. 22, 2022

(30) Foreign Application Priority Data

Mar. 19, 2021 (JP) ................................. 2021-045939

(51) Int. Cl.
*H10P 14/60* (2026.01)
*C23C 8/10* (2006.01)
(Continued)

(52) U.S. Cl.
CPC ............ *H10P 14/6319* (2026.01); *C23C 8/10* (2013.01); *C23C 8/36* (2013.01);
(Continued)

(58) Field of Classification Search
CPC ........ C23C 8/10; C23C 8/36; H01J 37/32449; H01J 2237/338; H01L 21/0214; H01L 21/02164; H01L 21/02236
See application file for complete search history.

(56) References Cited

U.S. PATENT DOCUMENTS 9,837,270 B1 12/2017 Varadarajan et al.
2008/0176413 A1* 7/2008 Sasaki ................. H01L 21/0223
257/E21.24
(Continued)

FOREIGN PATENT DOCUMENTS

JP 2014-075579 A 4/2014
JP 2019-033249 A 2/2019
(Continued)

OTHER PUBLICATIONS ip.com search (Year: 2026).*
(Continued)

*Primary Examiner* — Zandra V Smith
*Assistant Examiner* — Andre C Stevenson
(74) *Attorney, Agent, or Firm* — Volpe Koenig

(57) ABSTRACT

A method of manufacturing a semiconductor device includes: (a) generating a reactive species by plasma-exciting a process gas containing oxygen and hydrogen; and (b) supplying the reactive species to a substrate and oxidizing surfaces of a silicon film and a silicon nitride film formed to be exposed respectively on the substrate, wherein a ratio of oxygen and hydrogen contained in the process gas is adjusted such that a ratio of a thickness of a second oxide layer formed by oxidizing the surface of the silicon nitride film to a thickness of a first oxide layer formed by oxidizing the surface of the silicon film in (b) becomes a predetermined thickness ratio.

21 Claims, 7 Drawing Sheets

(51) Int. Cl.
|  |  |
|---|---|
| *C23C 8/36* | (2006.01) |
| *H01J 37/32* | (2006.01) |
| *H10P 14/692* | (2026.01) |

(52) U.S. Cl.
CPC .... *H01J 37/32449* (2013.01); *H10P 14/6308* (2026.01); *H10P 14/69215* (2026.01); *H10P 14/6927* (2026.01); *H01J 2237/338* (2013.01)

(56) References Cited

U.S. PATENT DOCUMENTS

| 2014/0106573 | A1 |  | 4/2014  | Terasaki           |
|--------------|----|--|---------|--------------------|
| 2016/0308060 | A1 | * | 10/2016 | Tanaka ............... H10D 30/6739 |
| 2017/0194135 | A1 |  | 7/2017  | Nakayama           |
| 2019/0019670 | A1 |  | 1/2019  | Lin et al.         |
| 2019/0355575 | A1 |  | 11/2019 | Takeshima          |
| 2020/0211858 | A1 |  | 7/2020  | Nakayama et al.    |
| 2022/0223381 | A1 | * | 7/2022  | Liu ....................... H01J 37/321 |
| 2022/0367175 | A1 |  | 11/2022 | Lin et al.         |

FOREIGN PATENT DOCUMENTS

| TW | 201835374  | A  | 10/2018 |
|----|------------|----|---------|
| TW | I676710    | B  | 11/2019 |
| WO | 2007/034871 | A1 | 3/2007  |
| WO | 2016/125606 | A1 | 8/2016  |
| WO | 2018/179038 | A1 | 10/2018 |

OTHER PUBLICATIONS

EPO Global Dossier JP2021045939 (Year: 2026).*

Japanese Office Action issued on Dec. 6, 2022 for Japanese Patent Application No. 2021-045939.

Taiwan Office Action issued on Nov. 25, 2022 for Taiwan Patent Application No. 110148067.

Singapore Search Report issued on Jul. 3, 2023 for Singapore Patent Application No. 10202201509V.

Singapore Written Opinion issued on Jul. 3, 2023 for Singapore Patent Application No. 10202201509V.

* cited by examiner

FIG. 7

METHOD OF MANUFACTURING SEMICONDUCTOR DEVICE, METHOD OF PROCESSING SUBSTRATE, RECORDING MEDIUM, AND SUBSTRATE PROCESSING APPARATUS

CROSS-REFERENCE TO RELATED APPLICATION(S)

This application is based upon and claims the benefit of priority from Japanese Patent Application No. 2021-045939, filed on Mar. 19, 2021, the entire contents of which are incorporated herein by reference.

TECHNICAL FIELD

The present disclosure relates to a method of manufacturing a semiconductor device, a method of processing a substrate, a recording medium, and a substrate processing apparatus.

BACKGROUND

In recent years, semiconductor devices such as flash memories have tended to be highly integrated. Along with this, the pattern size has been remarkably miniaturized. When forming these patterns, as one step of a manufacturing process, a step of performing a predetermined process such as an oxidation process or a nitridation process on a substrate may be performed.

For example, in the related art, a technique in which a pattern surface formed on a substrate is modified by using a plasma-excited process gas is known.

SUMMARY

In some cases, it may be desirable to selectively oxidize a silicon film and a silicon nitride film formed on a substrate to form an oxide layer.

Some embodiments of the present disclosure provide a technique capable of forming an oxide layer by selectively oxidizing a silicon film and a silicon nitride film formed on a substrate by using a plasma-excited oxygen-containing gas.

According to one or more embodiments of the present disclosure, there is provided a technique that includes: (a) generating a reactive species by plasma-exciting a process gas containing oxygen and hydrogen; and (b) supplying the reactive species to a substrate and oxidizing surfaces of a silicon film and a silicon nitride film formed to be exposed respectively on the substrate, wherein a ratio of oxygen and hydrogen contained in the process gas is adjusted such that a ratio of a thickness of a second oxide layer formed by oxidizing the surface of the silicon nitride film to a thickness of a first oxide layer formed by oxidizing the surface of the silicon film in (b) becomes a predetermined thickness ratio.

BRIEF DESCRIPTION OF DRAWINGS

The accompanying drawings, which are incorporated in and constitute a part of the specification, illustrate embodiments of the present disclosure.

FIG. 7 is a diagram showing a relationship between a ratio of hydrogen contained in a process gas and an oxidation ratio of a silicon nitride film to a silicon film.

DETAILED DESCRIPTION

Figure 1:
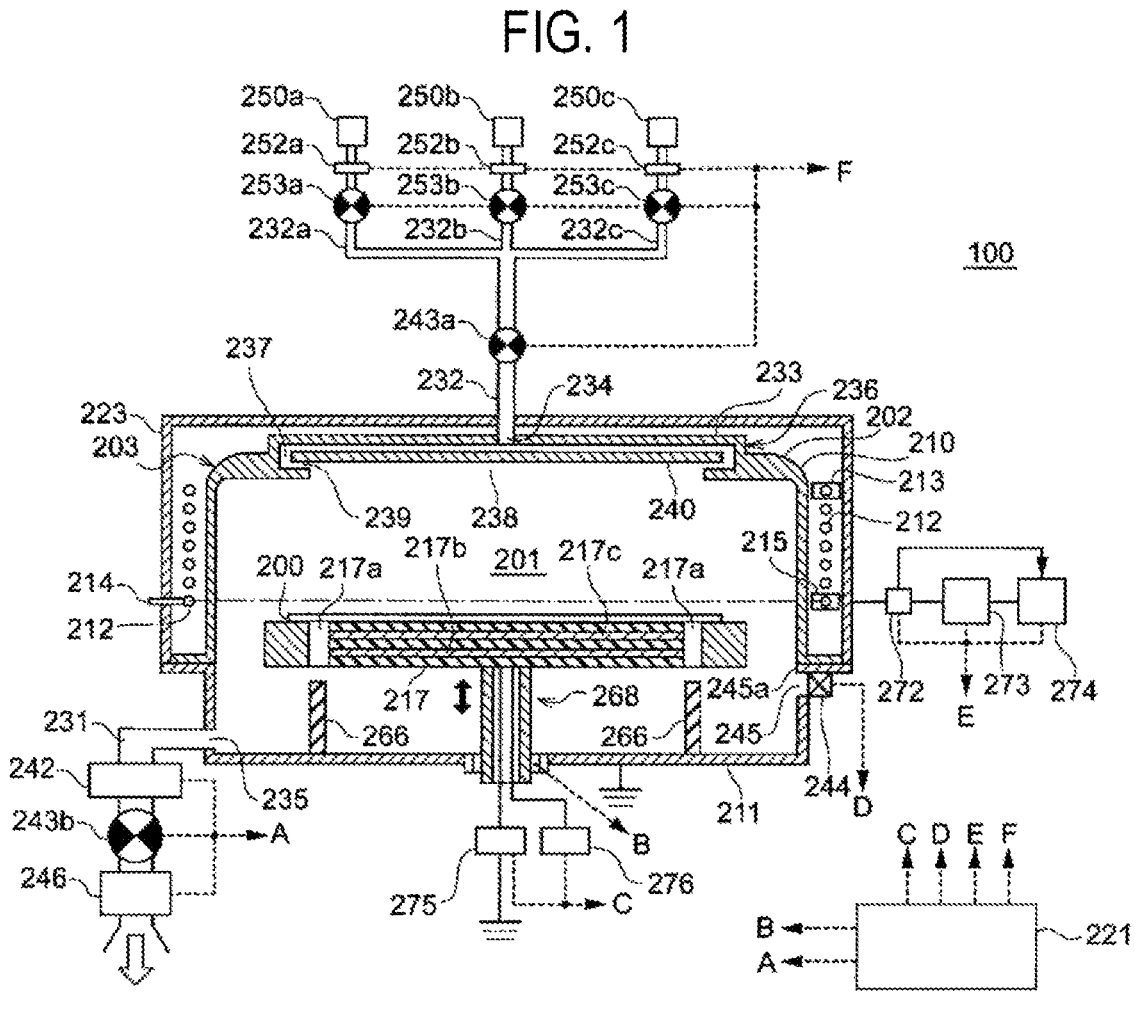
FIG. 1 is a schematic configuration view of a substrate processing apparatus suitably used in one or more embodiments of the present disclosure, in which a portion of a process furnace is shown in a longitudinal cross-sectional view.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

ONE OR MORE EMBODIMENTS OF THE PRESENT DISCLOSURE

One or more embodiments of the present disclosure will be now described with reference to FIGS. 1 to 7. The drawings used in the following description are schematic, and the dimensional relationship, ratios, and the like of various elements shown in figures do not always match the actual ones. Further, the dimensional relationship, ratios, and the like of various elements between plural figures do not always match each other.

First Embodiments

(1) Substrate Processing Apparatus

A substrate processing apparatus according to first embodiments of the present disclosure will be described below with reference to FIGS. 1 and 2. The substrate processing apparatus according to the present embodiments is configured to mainly perform an oxidizing process to a film formed on a surface of a wafer 200 as a substrate.

(Process Chamber)

The substrate processing apparatus 100 includes a process furnace 202 that plasma-processes the wafer 200. A process container 203 that constitutes a process chamber 201 is provided in the process furnace 202. The process container 203 includes a dome-shaped upper container 210, which is a first container, and a bowl-shaped lower container 211, which is a second container. The process chamber 201 is formed by covering the upper container 210 on the lower container 211. The upper container 210 is made of, for example, a non-metal material such as aluminum oxide ($Al_2O_3$) or quartz ($SiO_2$), and the lower container 211 is made of, for example, aluminum (Al).

A gate valve 244 is provided on a lower sidewall of the lower container 211. When the gate valve 244 is opened, the wafer 200 can be loaded/unloaded in/out of the process chamber 201 via a loading/unloading port 245 by using a transfer mechanism (not shown). The gate valve 244 is configured to be a gate valve that maintains airtightness in the process chamber 201 when it is closed.

The process chamber 201 includes a plasma-generating space 201*a* provided with a resonance coil 212 around it, and a substrate-processing space 201*b* communicating with the plasma-generating space, in which the wafer 200 is processed. The plasma-generating space 201*a* is a space in which plasma is generated, and refers to a space in the process chamber 201 above the lower end of the resonance coil 212 and below the upper end of the resonance coil 212. On the other hand, the substrate-processing space 201*b* is a space in which the wafer 200 is processed by using plasma, and refers to a space below the lower end of the resonance coil 212. In the present embodiments, the diameters of the plasma-generating space 201*a* and the substrate-processing space 201*b* in the horizontal direction are substantially the same.

(Susceptor)

A susceptor 217 as a substrate-mounting part on which the wafer 200 is mounted is disposed at the center of the bottom side of the process chamber 201. The susceptor 217 is made of, for example, a non-metal material such as aluminum nitride (AlN), ceramics, or quartz, and is configured to be able to reduce metal contamination on a film and the like formed on the wafer 200.

A heater 217*b* as a heating mechanism is integrally embedded in the susceptor 217. The heater 217*b* is configured to be able to heat the surface of the wafer 200 to, for example, 25 degrees C. to 750 degrees C. or so when electric power is supplied to the heater 217*b*.

The susceptor 217 is electrically insulated from the lower container 211. In order to further improve the uniformity of the density of plasma generated on the wafer 200 mounted on the susceptor 217, an impedance adjustment electrode 217*c* is provided inside the susceptor 217 and is grounded via an impedance variable mechanism 275 as an impedance adjustment part. The impedance variable mechanism 275 is composed of a coil and a variable capacitor, and is configured to be able to change the impedance within a range from about 0Ω to the parasitic impedance value of the process chamber 201 by controlling the inductance and resistance of the coil and the capacitance of the variable capacitor. Thereby, the potential (bias voltage) of the wafer 200 can be controlled via the impedance adjustment electrode 217*c* and the susceptor 217.

The susceptor 217 is provided with a susceptor-elevating mechanism 268 including a drive mechanism for raising and lowering the susceptor. Further, the susceptor 217 is provided with through-holes 217*a*, and wafer push-up pins 266 are provided on the bottom surface of the lower container 211. The through-holes 217*a* and the wafer push-up pins 266 are respectively provided at least three locations facing each other. When the susceptor 217 is lowered by the susceptor-elevating mechanism 268, the wafer push-up pins 266 penetrate through the through-holes 217*a* in a state where the wafer push-up pins 266 is in non-contact with the susceptor 217. The substrate-mounting part according to the present embodiments mainly includes the susceptor 217, the heater 217*b*, and the impedance adjustment electrode 217*c*.

(Gas Supply Part)

A gas supply head 236 is provided above the process chamber 201, that is, in the upper portion of the upper container 210. The gas supply head 236 includes a cap-shaped lid 233, a gas introduction port 234, a buffer chamber 237, an opening 238, a shielding plate 240, and a gas ejection port 239, and is configured to be able to supply a process gas into the process chamber 201. The buffer chamber 237 has a function as a dispersion space for dispersing the process gas introduced from the gas introduction port 234.

The downstream end of an oxygen-containing gas supply pipe 232*a* configured to supply an oxygen (O)-containing gas, the downstream end of a hydrogen-containing gas supply pipe 232*b* configured to supply a hydrogen (H)-containing gas, and an inert gas supply pipe 232*c* configured to supply an inert gas are connected to the gas introduction port 234 so as to merge with one another. The oxygen-containing gas supply pipe 232*a* is provided with an O-containing gas supply source 250*a*, a mass flow controller (MFC) 252*a* as a flow control device, and a valve 253*a* as an opening/closing valve, sequentially from the upstream side. The hydrogen-containing gas supply pipe 232*b* is provided with a H-containing gas supply source 250*b*, a MFC 252*b*, and a valve 253*b*, sequentially from the upstream side. The inert gas supply pipe 232*c* is provided with an inert gas supply source 250*c*, a MFC 252*c*, and a valve 253*c*, sequentially from the upstream side. A valve 243*a* is provided on the downstream side where the oxygen-containing gas supply pipe 232*a*, the hydrogen-containing gas supply pipe 232*b*, and the inert gas supply pipe 232*c* merge with one another, and is connected to the upstream end of the gas introduction port 234. The valves 253*a*, 253*b*, 253*c*, and 243*a* are opened/closed to allow process gases such as the O-containing gas, the H-containing gas, and the inert gas to be supplied into the process chamber 201 via the gas supply pipes 232*a*, 232*b*, and 232*c* while adjusting the flow rate of the gases by the MFCs 252*a*, 252*b*, and 252*c*, respectively.

A process gas supply part (process gas supply system) according to the present embodiments mainly includes the gas supply head 236 (the lid 233, the gas introduction port 234, the buffer chamber 237, the opening 238, the shielding plate 240, and the gas ejection port 239), the oxygen-containing gas supply pipe 232*a*, the hydrogen-containing gas supply pipe 232*b*, the inert gas supply pipe 232*c*, the MFCs 252*a*, 252*b*, and 252*c*, and the valves 253*a*, 253*b*, 253*c*, and 243*a*.

Further, an oxygen-containing gas supply system according to the present embodiments includes the gas supply head 236, the oxygen-containing gas supply pipe 232*a*, the MFC 252*a*, and the valves 253*a* and 243*a*. Further, a hydrogen-containing gas supply system according to the present embodiments includes the gas supply head 236, the hydrogen-containing gas supply pipe 232*b*, the MFC 252*b*, and the valves 253*b* and 243*a*. Further, an inert gas supply system according to the present embodiments includes the gas supply head 236, the inert gas supply pipe 232*c*, the MFC 252*c*, and the valves 253*c* and 243*a*.

(Exhaust Part)

A gas exhaust port 235 configured to exhaust a process gas from the interior of the process chamber 201 is provided on the sidewall of the lower container 211. The upstream end of a gas exhaust pipe 231 is connected to the gas exhaust port 235. The gas exhaust pipe 231 is provided with an auto pressure controller (APC) valve 242 as a pressure regulator (a pressure adjustment part), a valve 243b as an opening/closing valve, and a vacuum pump 246 as a vacuum exhaust device, sequentially from the upstream side. An exhaust part according to the present embodiments mainly includes the gas exhaust port 235, the gas exhaust pipe 231, the APC valve 242, and the valve 243b. The vacuum pump 246 may be included in the exhaust part.

(Plasma Generation Part)

The resonance coil 212, which has a spiral shape, as a first electrode, is provided on the outer peripheral portion of the process chamber 201, that is, on the outer side of the sidewall of the upper container 210, so as to surround the process chamber 201. A RF sensor 272, a high frequency power supply 273, and a matching device 274 that matches the impedance and output frequency of the high frequency power supply 273, are connected to the resonance coil 212.

The high frequency power supply 273 supplies high frequency power (RF power) to the resonance coil 212. The RF sensor 272 is provided on the output side of the high frequency power supply 273 and monitors information of a traveling wave and a reflected wave of the supplied high frequency. The reflected wave power monitored by the RF sensor 272 is input to the matching device 274, and the matching device 274 controls the impedance of the high frequency power supply 273 and the frequency of the output high frequency power so as to minimize the reflected wave, based on the information of the reflected wave input from the RF sensor 272.

The high frequency power supply 273 includes a power supply control means or a power supply unit (control circuit) including a high frequency oscillation circuit and a pream-plifier configured to define an oscillation frequency and an output, and an amplifier (output circuit) configured to amplify the output of the control circuit to a predetermined output. The power supply control means controls the ampli-fier based on a preset frequency and power output conditions via an operation panel. The amplifier supplies constant high frequency power to the resonance coil 212 via a transmission line.

The resonance coil 212 sets the winding diameter, winding pitch, and number of turns so as to be resonated at a constant wavelength in order to form a standing wave having a predetermined wavelength. That is, the electrical length of the resonance coil 212 is set to a length corresponding to an integral multiple (1 time, 2 times, . . . ) of one wavelength at a predetermined frequency of the high frequency power supplied from the high frequency power supply 273.

Both ends of the resonance coil 212 are electrically grounded, at least one selected from the group of both ends of which is grounded via a movable tap 213 in order to finely tune the electrical length of the resonance coil at the time of initial installation of the device or at the time of changing the process conditions. Reference numeral 214 in FIG. 1 denotes the other fixed ground. The position of the movable tap 213 is adjusted so as to make the resonance characteristic of the resonance coil 212 substantially equal to that of the high frequency power supply 273. Further, in order to finely tune the impedance of the resonance coil 212 at the time of initial installation of the device or at the time of changing the process conditions, a power-supplying part is configured by a movable tap 215 between the grounded ends of the resonance coil 212. Since the resonance coil 212 includes the variable ground portion and the variable power-supplying part, the resonance frequency and the load impedance of the process chamber 201 can be adjusted more easily, as will be described later.

A shielding plate 223 is provided to shield an electric field outside the resonance coil 212 and to form a capacitance component (C component) for forming a resonance circuit between the shielding plate 223 and the resonance coil 212. The shielding plate 223 is generally made of a conductive material such as an aluminum alloy and is formed in a cylindrical shape.

A plasma generation part (plasma generation mechanism) according to the present embodiments mainly includes the resonance coil 212, the RF sensor 272, and the matching device 274. The high frequency power supply 273 may be included as the plasma generation part.

Here, the plasma generation principle and the properties of the generated plasma of the apparatus according to the present embodiments will be described with reference to FIG. 2.

A plasma generation circuit composed of the resonance coil 212 is configured as an RLC parallel resonance circuit. When the wavelength of the high frequency power supplied from the high frequency power supply 273 is equal to the electrical length of the resonance coil 212, the reactance condition of the resonance coil 212 is that reactance components created by the capacitive component and the inductive component of the resonance coil 212 are cancelled out to become a pure resistance. However, in the above plasma generation circuit, when plasma is generated, the actual resonance frequency fluctuates slightly depending on a fluctuation in a capacitive coupling between a voltage part of the resonance coil 212 and the plasma, a fluctuation in an inductive coupling between the plasma-generating space 201a and the plasma, an excitation state of the plasma, and the like.

Therefore, in order to compensate a deviation of resonance in the resonance coil 212 on the power supply side when the plasma is generated, the present embodiments provide a function of detecting by the RF sensor 272 the reflected wave power from the resonance coil 212 when the plasma is generated, and correcting, by the matching device 274, the output of the high frequency power supply 273 based on the reflected wave power.

Specifically, the matching device 274 increases or decreases the impedance or output frequency of the high frequency power supply 273 so as to minimize the reflected wave power based on the reflected wave power from the resonance coil 212 when the plasma detected by the RF sensor 272 is generated. When controlling the impedance, the matching device 274 is configured by a variable capacitor control circuit that corrects the preset impedance, and when controlling the frequency, the matching device 274 is configured by a frequency control circuit that corrects the preset oscillation frequency of the high frequency power supply 273. Further, the high frequency power supply 273 and the matching device 274 may be integrally configured.

Figure 2:
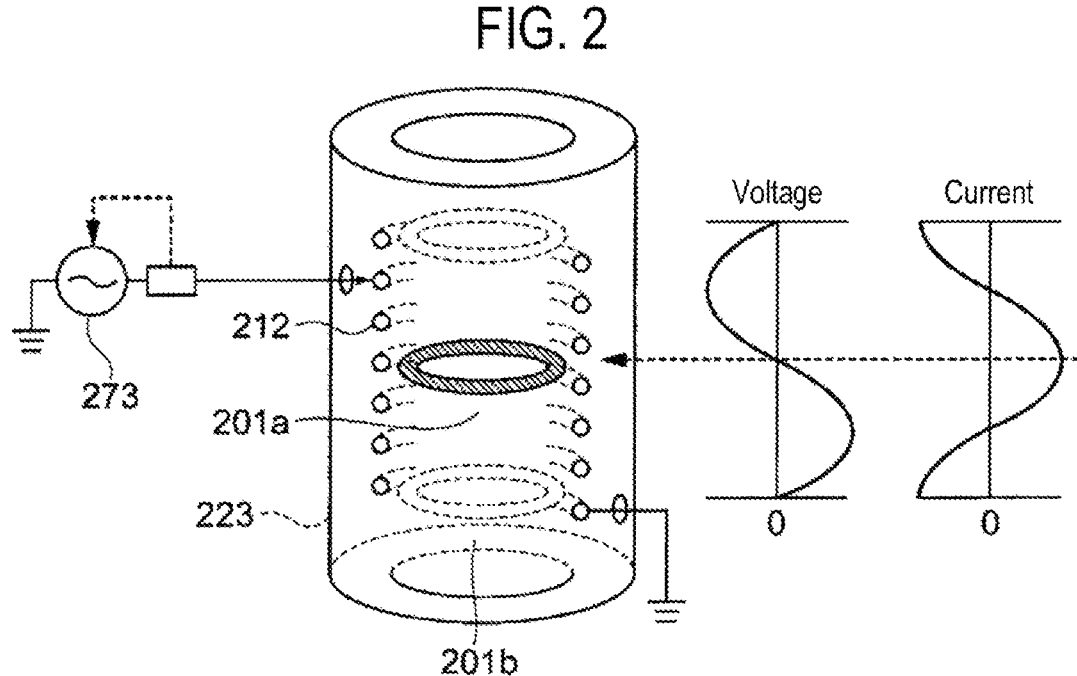
FIG. 2 is a diagram illustrating the principle of plasma generation in one or more embodiments of the present disclosure.

With this configuration, as shown in FIG. 2, since the resonance coil 212 in the present embodiments is supplied with high frequency power at the actual resonance frequency of the resonance coil containing plasma (or is supplied with the high frequency power so as to match with the actual impedance of the resonance coil containing plasma), a standing wave is formed in which a phase voltage and an anti-phase voltage are always cancelled out. When the electrical length of the resonance coil 212 is equal to the wavelength of the high frequency power, the highest phase current is generated at the electrical midpoint (node of zero voltage) of the coil. Therefore, in the vicinity of the electrical midpoint, since there is almost no capacitive coupling with the process chamber wall or the susceptor 217, donut-shaped inductive plasma having an extremely low electrical potential is formed.

(Control Part)

A controller 221 as a control part is configured to control the APC valve 242, the valve 243b, and the vacuum pump 246 via a signal line A, the susceptor-elevating mechanism 268 via a signal line B, a heater-power-adjusting mechanism 276 and the impedance variable mechanism 275 via a signal line C, the gate valve 244 via a signal line D, the RF sensor 272, the high frequency power supply 273, and the matching device 274 via a signal line E, and the MFCs 252a to 252c and the valves 253a to 253c and 243a via a signal line F.

Figure 3:
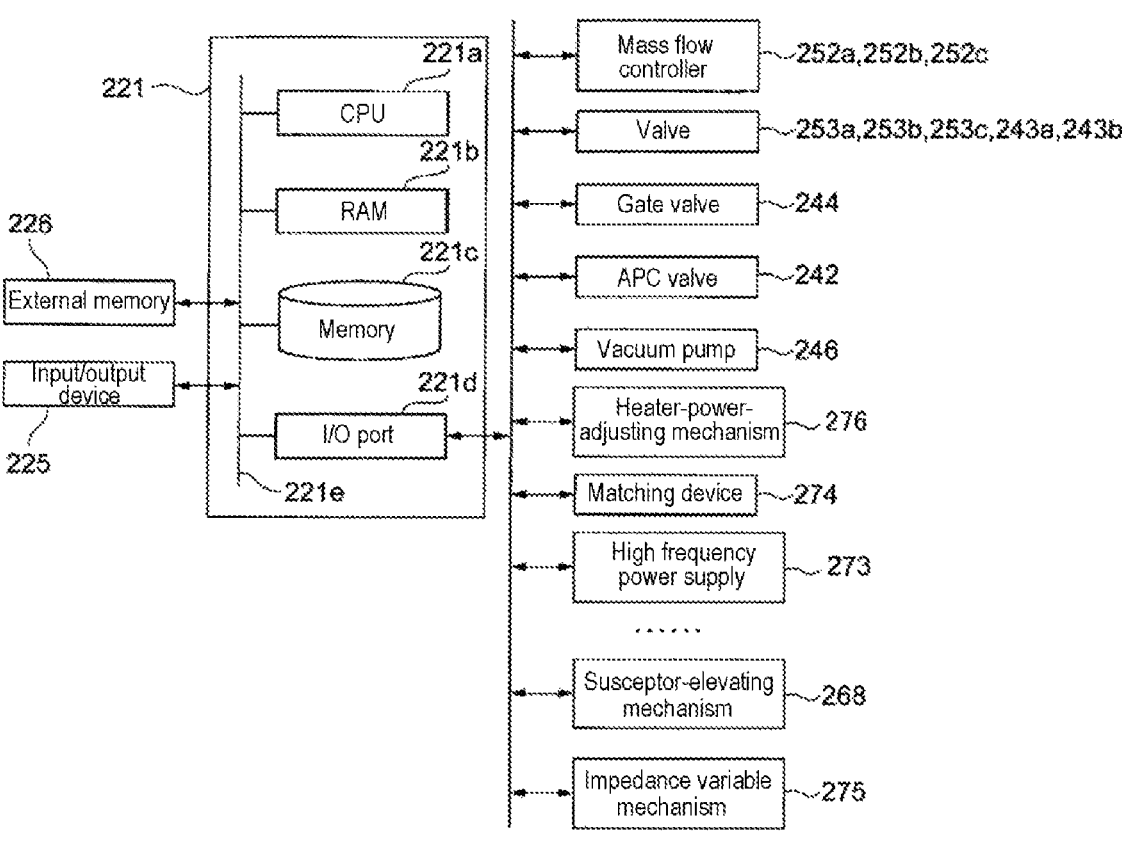
FIG. 3 is a schematic configuration diagram of a controller of a substrate processing apparatus suitably used in one or more embodiments of the present disclosure, in which a control system of the controller is shown as a block diagram.

As shown in FIG. 3, the controller 221, which is the control part (control means or control unit), is configured as a computer including a central processing unit (CPU) 221a, a random access memory (RAM) 221b, a memory 221c, and an I/O port 221d. The RAM 221b, the memory 221c, and the I/O port 221d are configured to be capable of exchanging data with the CPU 221a via an internal bus 221e. An input/output device 225 configured as, for example, a touch panel or a display, is connected to the controller 221.

The memory 221c is configured by, for example, a flash memory, a hard disk drive (HDD), or the like. A control program for controlling operations of a substrate processing apparatus, a process recipe in which sequences and conditions of substrate processing, which will be described later, are written, etc. are readably stored in the memory 221c. The process recipe functions as a program for causing the controller 221 to execute each sequence in a substrate-processing process, which will be described later, to obtain a predetermined result. Hereinafter, the process recipe and the control program may be generally and simply referred to as a "program." When the term "program" is used herein, it may indicate a case of including the process recipe, a case of including the control program, or a case of including both the process recipe and the control program. The RAM 221b is configured as a memory area (work area) in which a program or data read by the CPU 221a is temporarily stored.

The I/O port 221d is connected to the MFCs 252a to 252c, the valves 253a to 253c, 243a, and 243b, the gate valve 244, the APC valve 242, the vacuum pump 246, the RF sensor 272, the high frequency power supply 273, the matching device 274, the susceptor-elevating mechanism 268, the impedance variable mechanism 275, the heater-power-adjusting mechanism 276, and the like.

The CPU 221a is configured to read and execute the control program from the memory 221c. The CPU 221a is also configured to read the process recipe from the memory 221c according to an input of an operation command from the input/output device 225. Then, the CPU 221a is configured to control the operation of adjusting the opening degree of the APC valve 242, the opening/closing operation of the valve 243b, and the actuating and stopping of the vacuum pump 246 via the I/O port 221d and the signal line A, the elevating operation of the susceptor-elevating mechanism 268 via the signal line B, the operation of adjusting the amount of power supplied to the heater 217b (the temperature-adjusting operation) by the heater-power-adjusting mechanism 276 and the operation of adjusting the impedance by the impedance variable mechanism 275 via the signal line C, the opening/closing operation of the gate valve 244 via the signal line D, the operations of the RF sensor 272, the matching device 274, and the high frequency power supply 273 via the signal line E, the operation of adjusting flow rates of various kinds of gases by the MFCs 252a to 252c and the opening/closing operation of the valves 253a to 253c and 243a via the signal line F, and the like, according to contents of the read process recipe.

The controller 221 may be configured by installing, on the computer, the aforementioned program stored in an external memory (for example, a magnetic tape, a magnetic disk such as a flexible disk or a hard disk, an optical disc such as a CD or a DVD, a magneto-optical disc such as a MO, a semiconductor memory such as a USB memory or a memory card, and the like) 226. The memory 221c and the external memory 226 are configured as a non-transitory computer-readable recording medium. Hereinafter, the memory 221c and the external memory 226 may be generally and simply referred to as a "recording medium." When the term "recording medium" is used herein, it may indicate a case of including the memory 221c, a case of including the external memory 226, or a case of including both the memory 221c and the external memory 226. The program may be provided to the computer by using a communication means or a communication unit such as the Internet or a dedicated line, instead of using the external memory 226.

(2) Substrate-Processing Process

Figure 4:
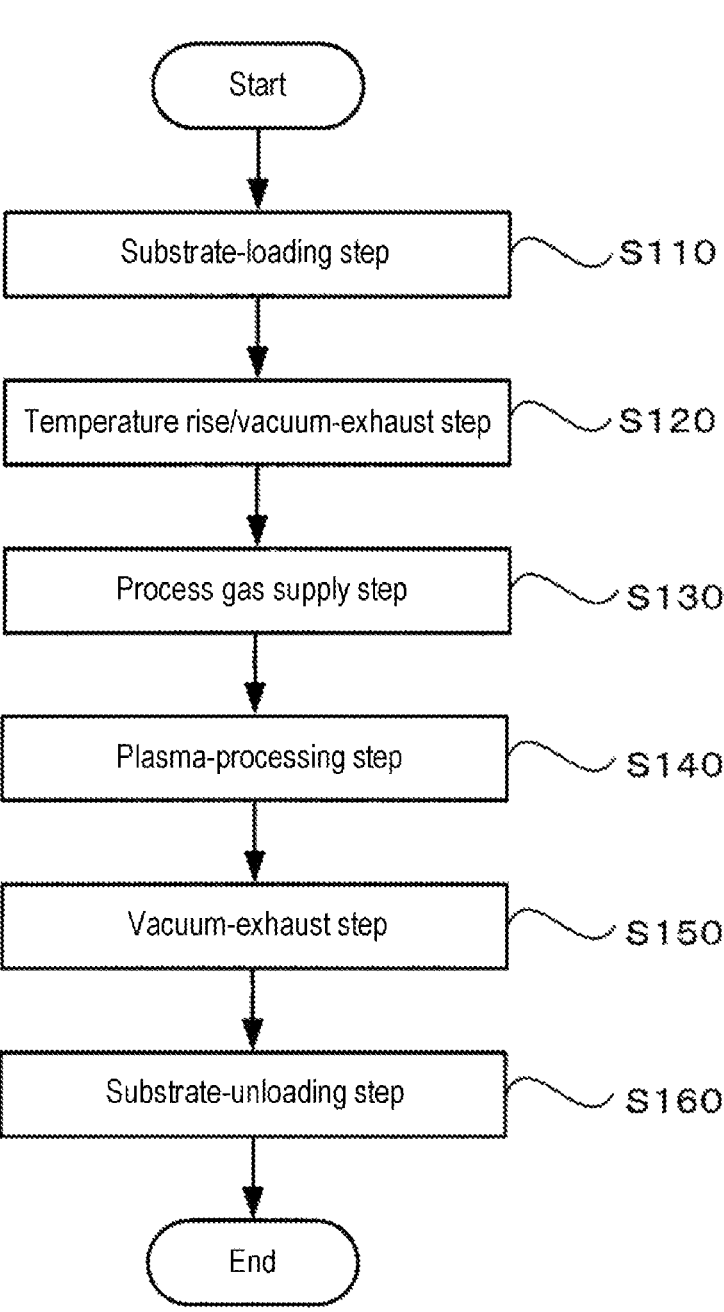
FIG. 4 is a flow chart showing a substrate-processing process in one or more embodiments of the present disclosure.

Next, a substrate-processing process according to one or more embodiments of the present disclosure will be described mainly with reference to FIG. 4. FIG. 4 is a flow chart showing a substrate-processing process according to one or more embodiments of the present disclosure. The substrate-processing process according to one or more embodiments of the present disclosure, which is one of processes of manufacturing a semiconductor device such as a flash memory, is performed by the above-described substrate processing apparatus 100. In the following description, the operations of various parts constituting the substrate processing apparatus 100 are controlled by the controller 221.

Figure 5A:
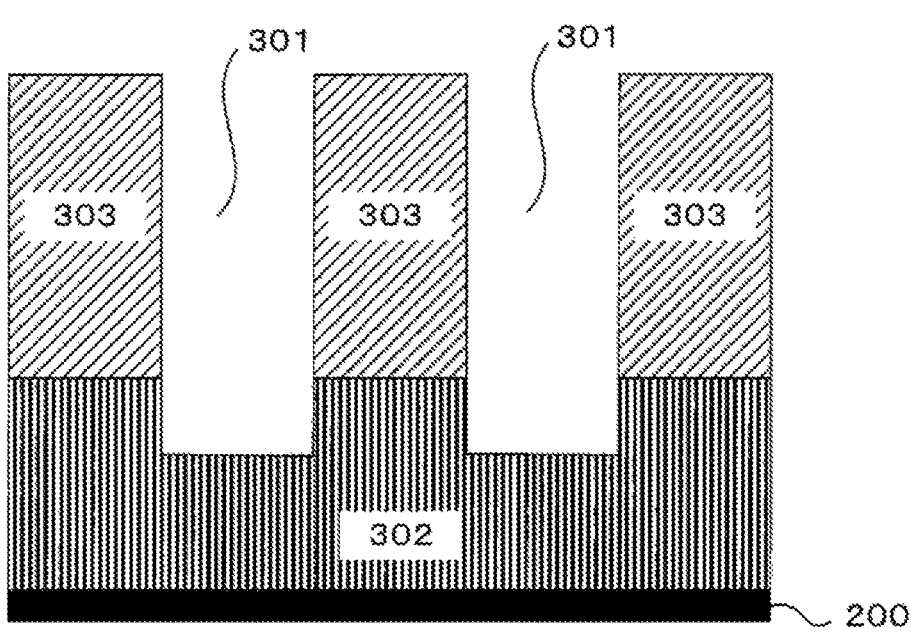
FIG. 5A is an explanatory view of a substrate on which a recess to be processed in a substrate-processing process in one or more embodiments of the present disclosure is formed.

For example, as shown in FIG. 5A, a recess 301 in which a silicon (Si) film 302 and a silicon nitride (SiN) film 303 are formed on at least the surface thereof is formed in advance on a wafer 200 to be processed in the substrate-processing process in one or more embodiments of the present disclosure. That is, in the wafer 200 to be processed in this substrate-processing process, the Si film 302 and the SiN film 303 are exposed inside the recess 301 formed on the wafer 200, and the Si film 302 constitutes the bottom of the recess 301. The recess 301 is, for example, a trench or a hole, and the aspect ratio of the recess 301 is 20 or more. In this substrate-processing process, the recess 301 is subjected to an oxidation process as a process using plasma. The Si film 302 is composed of at least one selected from the group of single crystal silicon (c-Si), amorphous silicon (a-Si), and polysilicon (Poly-Si).

(Substrate-Loading Step S110)

First, the wafer 200 is loaded into the process chamber 201. Specifically, the susceptor-elevating mechanism 268 lowers the susceptor 217 to a transfer position of the wafer 200 to penetrate the wafer push-up pins 266 through the through-holes 217a of the susceptor 217. As a result, the wafer push-up pins 266 protrude by a predetermined height from the surface of the susceptor 217.

Subsequently, the gate valve 244 is opened, and the wafer 200 is loaded into the process chamber 201 from a vacuum transfer chamber adjacent to the process chamber 201 by using a wafer transfer mechanism (not shown). The loaded wafer 200 is supported in a horizontal posture on the wafer push-up pins 266 protruded from the surface of the susceptor 217. After the wafer 200 is loaded into the process chamber 201, the wafer transfer mechanism is retracted to the outside of the process chamber 201, and the gate valve 244 is closed to seal the interior of the process chamber 201. Then, the susceptor-elevating mechanism 268 raises the susceptor 217 so that the wafer 200 is supported on the upper surface of the susceptor 217.

(Temperature Rise/Vacuum-Exhaust Step S120)

Subsequently, the temperature of the wafer 200 loaded into the process chamber 201 is raised. The heater 217b is preheated, and by holding the wafer 200 on the susceptor 217 in which the heater 217b is embedded, the wafer 200 is heated to a predetermined temperature in a range of, for example, 150 to 700 degrees C. Here, the wafer 200 is heated so as to have a temperature of 700 degrees C. Further, while the temperature of the wafer 200 is raised, the interior of the process chamber 201 is vacuum-exhausted by the vacuum pump 246 via the gas exhaust pipe 231 to set the internal pressure of the process chamber 201 to a predetermined value. The vacuum pump 246 keeps operated at least until a substrate-unloading step S160 to be described later is completed. The notation of a numerical range such as "150 to 700 degrees C." in the present disclosure means that the lower limit value and the upper limit value are included in the range. Therefore, for example, "150 to 700 degrees C." means "150 degrees C. or higher and 700 degrees C. or lower." The same applies to other numerical ranges.

(Process Gas Supply Step S130)

Next, the supply of a mixture of O-containing gas and H-containing gas, as a process gas, is started. That is, the mixture of O-containing gas and H-containing gas, as the process gas, is supplied into the process chamber 201 in which the wafer 200 is accommodated. Specifically, the valves 253a and 253b are opened, and the O-containing gas and the H-containing gas are started to be supplied into the process chamber 201 while their flow rates are controlled by the MFCs 252a and the MFC 252b, respectively. At this time, the flow rate of the O-containing gas is set to a predetermined value in a range of, for example, 10 to 50,000 sccm, specifically 10 to 5,000 sccm. Further, the flow rate of the H-containing gas is set to a predetermined value in a range of, for example, 10 to 50,000 sccm, specifically 10 to 5,000 sccm.

The ratio of O and H contained in the mixture of O-containing gas and H-containing gas, which is the process gas, is adjusted by controlling the flow rate ratio of the O-containing gas and the H-containing gas. As a result, the ratio of O and H contained in the process gas can be easily controlled. The ratio of O and H is the ratio of the number of O atoms and the number of H atoms contained in the process gas. For example, when a mixture of oxygen gas ($O_2$ gas) and hydrogen gas ($H_2$ gas) is used as the mixture of O-containing gas and H-containing gas, the flow rate ratio of O-containing gas and H-containing gas becomes the ratio of O and H as it is.

At this time, the ratio of O and H contained in the process gas is adjusted such that the ratio of the thickness of a SiO layer 304b as a second oxide layer formed by oxidizing the surface of the SiN film 303 to the thickness of a SiO layer 304a as a first oxide layer formed by oxidizing the surface of the Si film 302 in the recess 301 in the next plasma-processing step (S140) becomes a predetermined thickness ratio, for example, about 0.7. The SiO layer 304b as the second oxide layer formed by oxidizing the surface of the SiN film 303 may be considered to include a Si oxide layer (that is, a SiON layer) in which nitrogen remains in the layer at a predetermined concentration.

For example, by adjusting the ratio of H to O contained in the process gas so as to increase, the ratio of the thickness of the SiO layer 304b to the thickness of the SiO layer 304a can be reduced.

Further, the flow rate ratio of the O-containing gas and the H-containing gas supplied as the process gas is adjusted to a value corresponding to a predetermined thickness ratio acquired in advance and stored in the memory 221c or the external memory 226. In this way, by acquiring the predetermined thickness ratio in advance and storing it in the memory 221c or the external memory 226, it becomes easy to adjust the flow rate ratio of the O-containing gas and the H-containing gas such that the thickness ratio of the oxide films formed on the Si film 302 and the SiN film 303 becomes the predetermined thickness ratio.

At this time, the opening degree of the APC valve 242 is adjusted to control the exhaust of the interior of the process chamber 201 so that the internal pressure of the process chamber 201 becomes a predetermined pressure in a range of, for example, 1 to 250 Pa, specifically 50 to 200 Pa, more specifically about 150 Pa. In this way, while appropriately exhausting the interior of the process chamber 201, the supply of the O-containing gas and the H-containing gas is continued until the plasma-processing step S140 to be described later is completed.

(Plasma-Processing Step S140)

When the internal pressure of the process chamber 201 is stabilized, the application of the high frequency power to the resonance coil 212 from the high frequency power supply 273 via the RF sensor 272 is started. In the present embodiments, the high frequency power supply 273 supplies the high frequency power of 13.54 to 27.12 MHz to the resonance coil 212. The high frequency power supplied to the resonance coil 212 is predetermined power within a range of, for example, 100 to 5,000 W, specifically 100 to 3,500 W, more specifically about 3,500 W. When the power is lower than 100 W, it is difficult to stably generate plasma discharge.

As a result, a high frequency electric field is formed in the plasma-generating space 201a into which the O-containing gas and the H-containing gas are supplied, and donut-shaped induced plasma with the highest plasma density is excited at a height position corresponding to the electrical midpoint of the resonance coil 212 in the plasma-generating space by this electric field. The O-containing gas and the H-containing gas in the plasma state are dissociated to generate reactive species such as oxygen-active species such as oxygen (O) radicals, oxygen ions, and hydroxyl group (OH) radicals, and hydrogen-active species such as hydrogen (H) radicals and hydrogen ions.

That is, the process gas, which is the mixture of the O-containing gas and the H-containing gas supplied into process chamber 201, is plasma-excited to generate reactive species such as oxygen-active species and hydrogen-active species. Here, by producing reactive species having an oxidizing action such as oxygen-active species and reactive species having an oxidization inhibitory action such as hydrogen-active species, it is possible to obtain oxidation selectivity for the Si film and the SiN film.

Further, by performing oxidation using active species generated by induced plasma (ICP, Inductively Coupled Plasma) having an extremely low electrical potential, an oxide layer can be formed with good uniformity on a film formed on the surface of the recess 301 having a high aspect ratio of 20 or more. Further, for example, as in a case where the recess 301 is formed with respect to the surface formed perpendicular to the surface direction of the wafer 200, even if the recess 301 is not formed perpendicularly to the surface direction of the wafer 200, an oxide layer can be formed with good uniformity on a film formed on the surface thereof.

At this time, the ratio of O and H contained in the process gas is adjusted such that the ratio of the amount of the reactive species having an oxidizing action generated by plasma excitation and the amount of reactive species having an oxidization inhibitory action becomes a ratio corresponding to the thickness ratio of predetermined oxide layers. For example, by controlling the ratio of oxygen-active species (more specifically, for example, O radicals), which is reactive species having an oxidizing action, and hydrogen-active species (more specifically, for example, H radicals) which is reactive species having an oxidation inhibitory action, the thickness ratio of the SiO layer 304b to the SiO layer 304a can be adjusted.

Figure 5B:
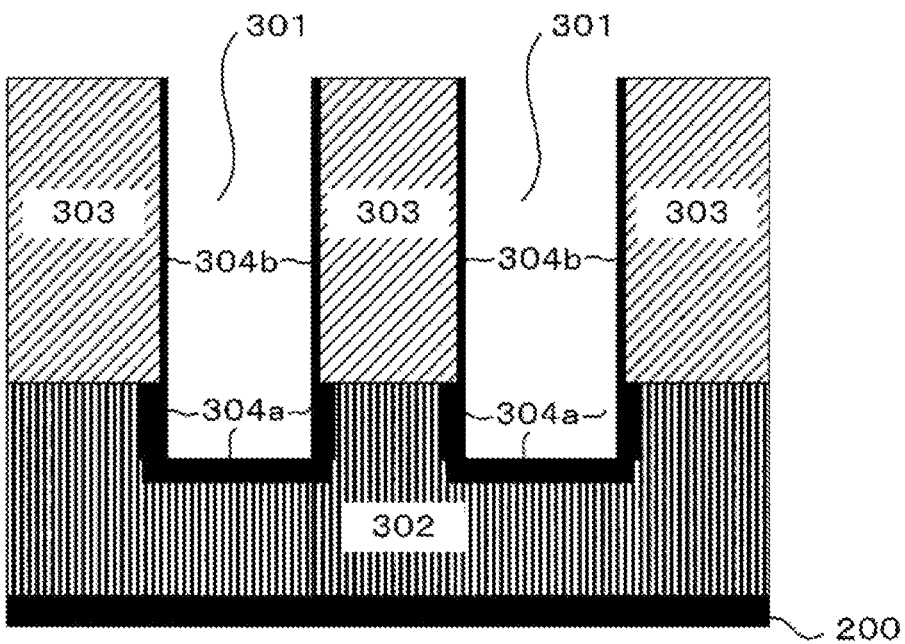
FIG. 5B is an explanatory view of the substrate when the substrate-processing process in one or more embodiments of the present disclosure is performed on the substrate of FIG. 5A.

Then, when the reactive species having an oxidizing action, such as oxygen-active species, and the reactive species having an oxidation inhibitory action, such as hydrogen-active species, are supplied to the wafer 200, the surfaces of the Si film 302 and the SiN film 303 formed to exposed in the recess 301 on the wafer 200 are oxidized to form the SiO layer 304a and the SiO layer 304b, respectively. That is, as shown in FIG. 5B, the SiO layer 304a having a uniform thickness is formed on the entire exposed surface of the Si film 302 constituting the bottom of the recess 301, and the SiO layer 304b having a uniform thickness is formed on the entire exposed surface of the SiN film 303 constituting the sidewall surface of the recess 301. Further, the SiO layer 304a having a thickness larger than that of the SiO layer 304b formed on the exposed surface of the SiN film 303 is formed on the exposed surface of the Si film 302 forming the bottom of the recess 301. That is, the surface of the Si film 304 can be selectively oxidized with respect to the surface of the SiN film 303 to form the SiO layer 304a which is an oxide layer.

Here, according to verifications by the present discloser, when the wafer 200 as shown in FIG. 5A is subjected to an oxidation process by a plasma-excited O$_2$ gas containing oxygen as a process gas, the ratio of the thickness of the oxide layer formed on the Si film and the thickness of the oxide layer formed on the SiN film exceeded 90%, and selectivity of about 93% was obtained. On the other hand, according to verifications of the present discloser, when a mixture of O$_2$ gas and H$_2$ gas, which is a mixture of O-containing gas and H-containing gas, is used as the process gas and the ratio of O and H contained in the mixture is adjusted, it was confirmed that the ratio of the thickness of the oxide layer formed on the Si film and the thickness of the oxide layer formed on the SiN film could be 90% or less. That is, it was confirmed that the ratio of the thickness of the oxide layer on the SiN film to the thickness of the oxide layer on the Si film when the mixture of O-containing gas and H-containing gas is used as the process gas could be controlled to be a value smaller than the ratio of the thickness of the oxide layer on the SiN film to the thickness of the oxide layer on the Si film when an O$_2$ gas is used as the process gas.

That is, by using the mixture of O-containing gas and H-containing gas as the process gas and adjusting the ratio of O and H contained in the process gas, it is possible to control the ratio of the thickness of the oxide layer on the SiN film to the thickness of the oxide layer on the Si film, as compared with a case where the O$_2$ gas is used as the process gas. That is, this makes it possible to control the selectivity of the thicknesses of the oxide layers formed on the Si film and the SiN film.

Specifically, by adjusting the ratio of O-containing gas and H-containing gas contained in the process gas such that the ratio of the number of H atoms to the total number of 0 atoms and H atoms contained in the process gas becomes 5% or more, it is possible to set the ratio of the thickness of the SiO layer 304b to the thickness of the SiO layer 304a to 90% or less. Further, by adjusting the ratio of O-containing gas and H-containing gas contained in the process gas such that the ratio of the number of H atoms to the total number of 0 atoms and H atoms contained in the process gas becomes 10% or more, it is possible to set the ratio of the thickness of the SiO layer 304b to the thickness of the SiO layer 304a to 80% or less. Further, by adjusting the ratio of O-containing gas and H-containing gas contained in the process gas such that the ratio of the number of H atoms to the total number of 0 atoms and H atoms contained in the process gas becomes 20% or more, it is possible to set the ratio of the thickness of the SiO layer 304b to the thickness of the SiO layer 304a to 70% or less.

If the ratio of the number of H atoms contained in the process gas exceeds, for example, 80%, a practical oxidation rate for the Si film cannot be obtained. By setting the ratio of O-containing gas and H-containing gas contained in the process gas to a value such that the ratio of the number of H atoms to the total number of 0 atoms and H atoms contained in the process gas is 80% or less, it is possible to obtain the selectivity of the thicknesses of the oxide layers while maintaining a practical oxidation rate for the Si film. When a mixture of O$_2$ gas and H$_2$ gas is used as the process gas, the ratio of the number of 0 atoms and H atoms contained in the process gas is the ratio of the supply amount of the O$_2$ gas and the H$_2$ gas as it is.

After that, with the lapse of a predetermined processing time, for example, 10 to 300 seconds, the output of the power from the high frequency power supply 273 is stopped to stop the plasma discharge in the process chamber 201. Further, the valve 253a and the valve 253b are closed to stop the supply of the O-containing gas and the H-containing gas into the process chamber 201. From the above, the plasma-processing step S140 is completed.

(Vacuum-Exhaust Step S150)

When the supply of the O-containing gas and the H-containing gas is stopped, the interior of the process chamber 201 is vacuum-exhausted through the gas exhaust pipe 231. As a result, the O-containing gas and the H-containing gas in the process chamber 201, an exhaust gas generated by the reaction of these gases, and the like are exhausted to the outside of the process chamber 201. After that, the opening degree of the APC valve 242 is adjusted to adjust the internal pressure of the process chamber 201 to the same pressure as the vacuum transfer chamber (the unloading destination of the wafer 200, not shown) adjacent to the process chamber 201.

(Substrate-Unloading Step S160)

When the interior of the process chamber 201 reaches a predetermined pressure, the susceptor 217 is lowered to the transfer position of the wafer 200, and the wafer 200 is supported on the wafer push-up pins 266. Then, the gate valve 244 is opened, and the wafer 200 is unloaded to the outside of the process chamber 201 by using the wafer transfer mechanism. From the above, the substrate-processing process according to the present embodiments is completed.

Examples of the O-containing gas may include an $O_2$ gas, an ozone ($O_3$) gas, water vapor ($H_2O$ gas), a hydrogen peroxide ($H_2O_2$) gas, a nitric oxide (NO) gas, a nitrous oxide ($N_2O$) gas, and the like. At least one selected from the group of these gases can be used as the O-containing gas.

Further, examples of the H-containing gas may include a $H_2$ gas, a $H_2O$ gas, a $H_2O_2$ gas, a deuterium ($D_2$) gas, and the like. At least one selected from the group of these gases can be used as the H-containing gas.

As the O-containing gas and the H-containing gas, different gases are used. For example, as the O-containing gas and the H-containing gas, gases having different ratios of the number of O atoms and H atoms contained for the flow rate of each gas are used. Further, as the O-containing gas and the H-containing gas, gases having different ratios of the numbers of 0 atoms and H atoms contained in the composition (molecular structure) of each gas are used.

(4) Other Embodiments

Second Embodiments

Figure 6:
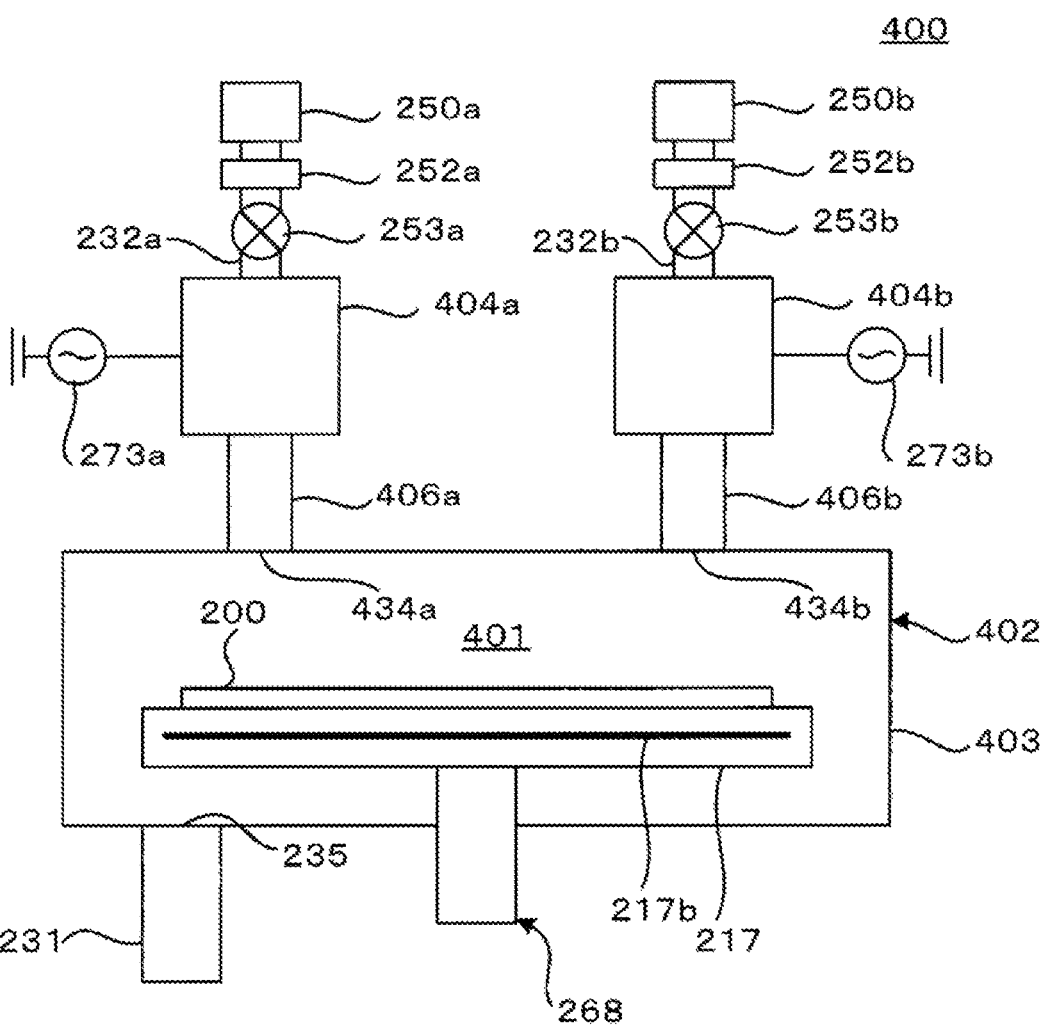
FIG. 6 is a view showing a modification of the substrate processing apparatus suitably used in one or more embodiments of the present disclosure.

Next, second embodiments of the present disclosure will be described with reference to FIG. 6. Here, the differences from the above-described first embodiments will be mainly described, and explanation of other points will be omitted. In the second embodiments, the configuration of a substrate processing apparatus is different from that of the first embodiments. Others are the same as in the first embodiments. In the second embodiments, the configuration of the substrate processing apparatus will be described below.

The substrate processing apparatus 400 includes a process furnace 402 for plasma-processing a wafer 200. The process furnace 402 is provided with a process container 403 that constitutes the process chamber 401.

A susceptor 217 as a substrate-mounting part on which the wafer 200 is mounted is disposed at the center of the bottom side of the process chamber 401. A heater 217b as a heating mechanism is integrally embedded inside the susceptor 217. The heater 217b is configured to be able to heat the surface of the wafer 200 to, for example, 25 degrees C. to 750 degrees C. or so when electric power is supplied to the heater 217b.

The susceptor 217 is provided with a susceptor-elevating mechanism 268 including a drive mechanism configured to raise and lower the susceptor.

A gas introduction port 434a and a gas introduction port 434b are provided above the process chamber 401.

The downstream end of a supply pipe 406a configured to supply oxygen-active species or the like as reactive species having an oxidizing action into the process chamber 401 is connected to the gas introduction port 434a. A first plasma excitation chamber 404a is connected to the upstream end of the supply pipe 406a. The downstream end of an oxygen-containing gas supply pipe 232a configured to supply an O-containing gas is connected to the first plasma excitation chamber 404a. The oxygen-containing gas supply pipe 232a is provided with an O-containing gas supply source 250a, a MFC 252a, and a valve 253a, sequentially from the upstream side. A high frequency power supply 273a is connected to the first plasma excitation chamber 404a.

The downstream end of a supply pipe 406b for supplying hydrogen-active species or the like as reactive species having an oxidation inhibitory action into the process chamber 401 is connected to the gas introduction port 434b. A second plasma excitation chamber 404b is connected to the upstream end of the supply pipe 406b. The downstream end of a hydrogen-containing gas supply pipe 232b configured to supply a H-containing gas is connected to the second plasma excitation chamber 404b. The hydrogen-containing gas supply pipe 232b is provided with a H-containing gas supply source 250b, a MFC 252b, and a valve 253b, sequentially from the upstream side. A high frequency power supply 273b is connected to the second plasma excitation chamber 404b.

Further, in each of the first plasma excitation chamber 404a and the second plasma excitation chamber 404b, for example, a coil to which high frequency power is supplied from the high frequency power supply 273a or the high frequency power supply 273b is wound, and a gas introduced into each of the first plasma excitation chamber 404a and the second plasma excitation chamber 404b is plasma-excited by an electromagnetic field generated from the coil. In this way, the O-containing gas introduced into the first plasma excitation chamber 404a is plasma-excited to generate the oxygen-active species, and the H-containing gas introduced into the second plasma excitation chamber 404b is plasma-excited to generate the hydrogen-active species. A plasma excitation means (or a plasma excitation unit) of the gas is not limited to the coil, and other plasma excitation means (or other plasma excitation unit) such as a microwave supply device may be applied.

An oxygen-containing gas supply system according to the present embodiments mainly includes the oxygen-containing gas supply pipe 232a, the MFC 252a, the valve 253a, the first plasma excitation chamber 404a, and the supply pipe 406a. A hydrogen-containing gas supply system according to the present embodiments mainly includes the hydrogen-containing gas supply pipe 232b, the MFC 252b, the valve 253b, the second plasma excitation chamber 404b, and the supply pipe 406b. Further, a process gas supply system includes the oxygen-containing gas supply system and the hydrogen-containing gas supply system.

In the first plasma excitation chamber 404a, the O-containing gas supplied by the oxygen-containing gas supply pipe 232a is plasma-excited to generate the oxygen-active species. Further, in the second plasma excitation chamber 404b, the H-containing gas supplied by the hydrogen-containing gas supply pipe 232b is plasma-excited to generate the hydrogen-active species. A plasma generation part (plasma generation mechanism) according to the present embodiments mainly includes the first plasma excitation chamber 404a and the second plasma excitation chamber 404b. The high frequency power supplies 273a and 273b may be included in the plasma generation part.

That is, the valves 253a and 253b are respectively opened to supply the respective gases to the first plasma excitation chamber 404a and the second plasma excitation chamber 404b while adjusting the flow rates of the respective gases by the MFCs 252a and 252b. Then, by plasma-exciting the respective gases in the first plasma excitation chamber 404a and the second plasma excitation chamber 404b, the oxygen-active species and the hydrogen-active species can be supplied to the process chamber 401 via the supply pipes 406a and 406b, respectively.

That is, the oxygen-active species and the hydrogen-active species supplied into the process chamber 401 from the gas introduction ports 434a and 434b, respectively, are supplied to the wafer 200 to form the SiO layer 304a and the SiO layer 304b having a predetermined film thickness ratio, as shown in FIG. 5B, in the recess 301 in which the Si film 302 and the SiN film 303 as shown in FIG. 5A are exposed.

According to the substrate processing apparatus 400, the supply amounts of oxygen-active species and the supply amount of hydrogen-active species can be individually controlled. That is, the ratio of the amount of oxygen-active species generated in the first plasma excitation chamber 404a and the amount of hydrogen-active species generated in the second plasma excitation chamber 404b can be adjusted to an active species ratio corresponding to the thickness ratio of the predetermined oxide layers. That is, by controlling the ratio of the amounts of oxygen-active species and hydrogen-active species supplied to the wafer 200, it is possible to adjust the thickness ratio of the SiO layer 304b to the SiO layer 304a. Further, the ratio of the amounts of oxygen-active species and hydrogen-active species supplied to the wafer 200 is adjusted by controlling at least one selected from the group of the flow rate ratio of the O-containing gas supplied into the first plasma excitation chamber 404a and the H-containing gas supplied into the second plasma excitation chamber 404b and the power ratio of the high frequency power that excites the O-containing gas supplied into the first plasma excitation chamber 404a and the high frequency power that excites the H-containing gas supplied into the second plasma excitation chamber 404b.

That is, by controlling the MFCs 252a and 252b, respectively, to control the flow rate ratio of the O-containing gas and the H-containing gas, or by controlling the high frequency power supplies 273a and 273b, respectively, to control the power ratio of the high frequency power applied to the first plasma excitation chamber and the second plasma excitation chamber, it is possible to individually adjust the amounts of oxygen-active species and hydrogen-active species supplied to the wafer 200 in the process chamber 401. That is, by adjusting the ratio of the amounts of oxygen-active species and hydrogen-active species supplied to the wafer 200, the ratio of the thickness of the SiO layer 304b formed by oxidizing the surface of the SiN film 303 to the thickness of the SiO layer 304a formed by oxidizing the surface of the Si film 302 can be adjusted to be a predetermined thickness ratio. Further, the ratio of the supply amounts of oxygen-active species and hydrogen-active species may be adjusted to a ratio between specific types of oxygen-active species and hydrogen-active species, such as the ratio of the supply amounts of O radicals and H radicals.

Even when the above-described substrate processing apparatus 400 is used, the film formation can be performed under the same substrate-processing process and process conditions as those of the above-described first embodiments, and the same effects as those of the above-described first embodiments can be obtained. That is, even when the substrate processing apparatus 400 is used, the oxide layer can be selectively and uniformly formed on the exposed surface of the Si film constituting the bottom of the recess in which the Si film and the SiN film are exposed.

As the O-containing gas and the H-containing gas, the same gases as the O-containing gas and the H-containing gas in the above-described first embodiments can be used, respectively. Further, as in the first embodiments, different gases are used for the O-containing gas and the H-containing gas.

In the second embodiments, a gas (for example, an $O_2$ gas, an $O_3$ gas), a NO gas, a $N_2O$ gas, etc.) that does not contain H may be used as the O-containing gas, and a gas (for example, a $H_2$ gas, a $D_2$ gas, etc.) that does not contain O may be used as the H-containing gas. By combining such O-containing gas and H-containing gas, it can be easier to adjust the ratio of the amounts of oxygen-active species and hydrogen-active species supplied from the oxygen-containing gas supply system and the hydrogen-containing gas supply system, respectively, by at least one selected from the group of the control of the flow rate ratio of the O-containing gas and the H-containing gas and the control of the high frequency power supplies 273a and 273b.

Although various typical embodiments of the present disclosure have been described above, the present disclosure is not limited to these embodiments, but may be used in proper combination thereof.

Example 1

By using the substrate processing apparatus shown in FIG. 1, in the substrate-processing process shown in FIG. 4, the ratio of H to the total of O and H contained in a mixture of O-containing gas and H-containing gas, which is a process gas, was changed to 5 to 20% to oxidize a Si film and a SiN film formed on a wafer. Then, the ratio of the thickness of an oxide film formed on the SiN film to the thickness of an oxide layer formed on the Si film (oxidation selection ratio) was evaluated.

Figure 7:
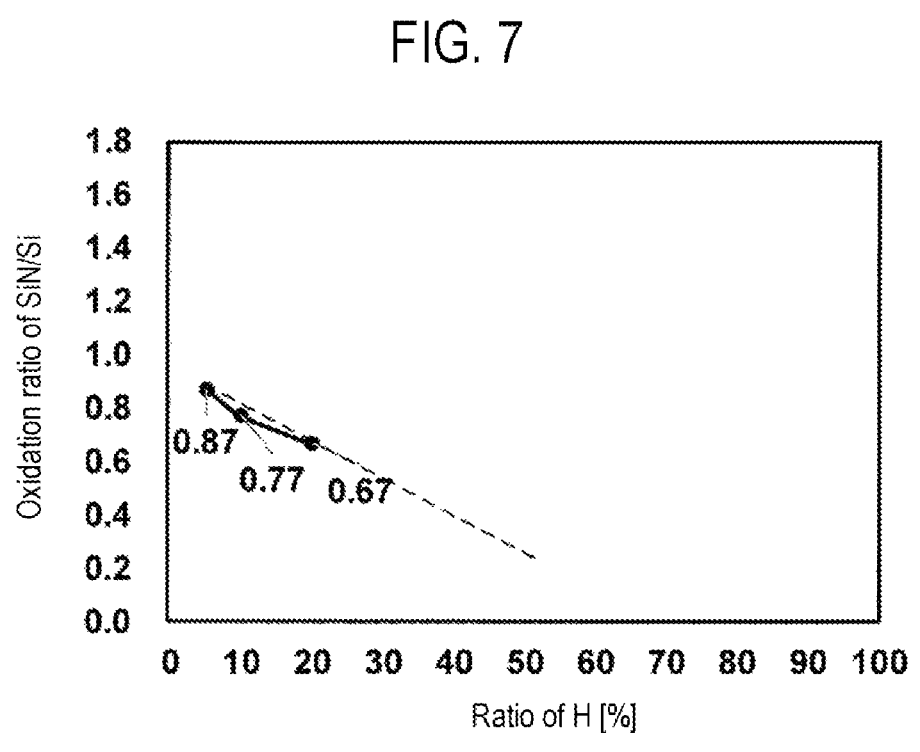

As shown in FIG. 7, when the ratio of H to the total of O and H contained in the mixture as the process gas was set to 5%, the oxidation selection ratio, which is the oxidation ratio of the SiN film to the Si film, was 87%. Therefore, it was confirmed that the oxidation selection ratio could be adjusted to 90% or less by adjusting the ratio of H to the total of O and H contained in the mixture to 5% or more.

Further, when the ratio of H to the total of O and H contained in the mixture as the process gas was set to 10%, the oxidation selection ratio of the SiN film to the Si film was 77%. Therefore, it was confirmed that the oxidation selection ratio could be adjusted to 80% or less by adjusting the ratio of H to the total of O and H contained in the mixture to 10% or more.

Further, when the ratio of H to the total of O and H contained in the mixture as the process gas was set to 20%, the oxidation selection ratio of the SiN film to the Si film was 67%. Therefore, it was confirmed that the oxidation selection ratio could be adjusted to 70% or less by adjusting the ratio of H to the total of O and H contained in the mixture to 20% or more.

Further, if the ratio of H to the total of O and H contained in the mixture of O-containing gas and H-containing gas is set to be larger than 20%, it is presumed that the oxidation selection ratio of the SiN film to the Si film becomes smaller. That is, by adjusting the ratio of H to the total of O and H contained in the process gas to increase, it was confirmed that the oxidation selection ratio of the SiN film to the Si film could be reduced, thereby improving the oxidation selectivity.

In addition, by using the substrate processing apparatus shown in FIG. 1, in the substrate-processing process shown in FIG. 4, for two experimental examples using different magnitudes of high frequency power for exciting the mixture, the ratio of thicknesses of oxide films formed on the Si film and the SiN film of the wafer was evaluated, but in either case, the oxidation selection ratio was about 0.87, and the oxidation selectivity was not confirmed. Further, by using the substrate processing apparatus shown in FIG. 1, in the substrate-processing process shown in FIG. 4, for two experimental examples using different internal pressures of the process chamber, the ratio of thicknesses of oxide films formed on the Si film and the SiN film of the wafer was evaluated, but in either case, the oxidation selection ratio was about 0.87, and the oxidation selectivity was not confirmed. Further, by using the substrate processing apparatus shown in FIG. 1, in the substrate-processing process shown in FIG. 4, for two experimental examples using different temperature of the wafer, the ratio of thicknesses of oxide films formed on the Si film and the SiN film of the wafer was evaluated, but the oxidation selection ratio was about 0.87 and 0.88, respectively, which showed a slight difference, and the oxidation selectivity was not confirmed. Further, by using the substrate processing apparatus shown in FIG. 1, in the substrate-processing process shown in FIG. 4, for two experimental examples using different heights of the wafer with respect to a plasma source, the ratio of thicknesses of oxide films formed on the Si film and the SiN film of the wafer was evaluated, but in either case, the oxidation selection ratio was about 0.87, and the oxidation selectivity was not confirmed.

According to the present disclosure in some embodiments, it is possible to form an oxide layer by selectively oxidizing a silicon film and a silicon nitride film formed on a substrate by using a plasma-excited oxygen-containing gas.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
(a) generating a reactive species by plasma-exciting a process gas containing oxygen and hydrogen; and
(b) supplying the reactive species to the substrate and oxidizing surfaces of a silicon film and a silicon nitride film formed to be exposed respectively on the substrate,
wherein a ratio of a number of hydrogen atoms to a total number of oxygen atoms and hydrogen atoms contained in the process gas is adjusted to 5% or more and 20% or less such that a ratio of a thickness of a second oxide layer formed by oxidizing the surface of the silicon nitride film to a thickness of a first oxide layer formed by oxidizing the surface of the silicon film in (b) becomes a predetermined thickness ratio in a range of 67% or more and 90% or less, and
wherein the ratio of the number of hydrogen atoms to the total number of oxygen atoms and hydrogen atoms is adjusted such that the ratio of the number of hydrogen atoms to the total number of oxygen atoms and hydrogen atoms increases as the predetermined thickness ratio decreases.

2. The method of claim 1, further comprising:
(c) adjusting the ratio of the number of hydrogen atoms to the total number of oxygen atoms and hydrogen atoms contained in the process gas such that the ratio of the thickness of the second oxide layer to the thickness of the first oxide layer becomes the predetermined thickness ratio.

3. The method of claim 1, wherein the ratio of the number of hydrogen atoms to the total number of oxygen atoms and hydrogen atoms contained in the process gas is adjusted to a value corresponding to the predetermined thickness ratio acquired in advance.

4. The method of claim 1, wherein in (a), at least an oxygen-active species and a hydrogen-active species are generated as the reactive species.

5. The method of claim 4, wherein the ratio of the number of hydrogen atoms to the total number of oxygen atoms and hydrogen atoms contained in the process gas is adjusted such that a ratio of an amount of the oxygen-active species and an amount of the hydrogen-active species supplied to the substrate in (b) becomes an active species ratio corresponding to the predetermined thickness ratio.

6. The method of claim 1, wherein the predetermined thickness ratio is a value smaller than the ratio of the thickness of the second oxide layer to the thickness of the first oxide layer if a gas containing oxygen is used as the process gas in (a) and (b).

7. The method of claim 1, wherein the ratio of the number of hydrogen atoms to the total number of oxygen atoms and hydrogen atoms contained in the process gas is adjusted to 10% or more.

8. The method of claim 1, wherein the process gas is a mixture of an oxygen-containing gas and a hydrogen-containing gas.

9. The method of claim 8, wherein the oxygen-containing gas is an oxygen gas, and the hydrogen-containing gas is a hydrogen gas.

10. The method of claim 8 or 9, wherein the ratio of the number of oxygen atoms and the number of hydrogen atoms contained in the process gas is adjusted by controlling a flow rate ratio of the oxygen-containing gas and the hydrogen-containing gas.

11. The method of claim 1, wherein the silicon film is composed of at least one selected from the group of single crystal silicon, amorphous silicon, and polycrystalline silicon.

12. The method of claim 1, wherein in (a), the process gas is supplied into a process chamber in which the substrate is accommodated, and the process gas supplied into the process chamber is plasma-excited.

13. The method of claim 1, wherein, in (b) and (c), a pressure in a process chamber in which the substrate is processed is 1 Pa or more and 250 Pa or less.

14. The method of claim 13, wherein the ratio of the number of hydrogen atoms to the total number of oxygen atoms and hydrogen atoms is adjusted such that the ratio of the thickness of the second oxide layer to the thickness of the first oxide layer is constant despite changes in the pressure in the process chamber in (b) and (c).

15. The method of claim 1, wherein, in (b) and (c), a pressure in a process chamber in which the substrate is processed is 50 Pa or more and 200 Pa or less.

16. The method of claim 1, wherein the silicon film and the silicon nitride film are exposed inside a recess formed on the substrate, and the silicon film constitutes a bottom of the recess, and
wherein in (b), the first oxide layer having a uniform thickness is formed on an entire exposed surface of the silicon film constituting the bottom of the recess.

17. The method of claim 16, wherein an aspect ratio of the recess is 20 or more.

18. A method of processing a substrate, comprising:
(a) generating an oxygen-active species by plasma-exciting an oxygen-containing gas;
(b) generating a hydrogen-active species by plasma-exciting a hydrogen-containing gas; and
(c) supplying the oxygen-active species and the hydrogen-active species to the substrate and oxidizing surfaces of a silicon film and a silicon nitride film formed to be exposed respectively on the substrate,
wherein a ratio of the hydrogen-active species to a sum of the oxygen-active species and the hydrogen-active species supplied to the substrate is adjusted to 5% or more and 20% or less such that a ratio of a thickness of a second oxide layer formed by oxidizing the surface of the silicon nitride film to a thickness of a first oxide layer formed by oxidizing the surface of the silicon film in (c) becomes a predetermined thickness ratio in a range of 67% or more and 90% or less, and wherein the ratio of hydrogen-active species to the sum of the oxygen-active species and the hydrogen-active species is adjusted such that the ratio of the hydrogen-active species to the sum of the oxygen-active species and the hydrogen-active species increases as the predetermined thickness ratio decreases.

19. The method of claim 18, wherein the oxygen-active species is generated in a first plasma excitation chamber, and the hydrogen-active species is generated in a second plasma excitation chamber.

20. The method of claim 19, wherein a ratio of amounts of the oxygen-active species and the hydrogen-active species supplied to the substrate is adjusted by controlling at least one selected from the group of:

a flow rate ratio of the oxygen-containing gas supplied to the first plasma excitation chamber and the hydrogen-containing gas supplied to the second plasma excitation chamber; and a power ratio of high frequency power that excites the oxygen-containing gas supplied to the first plasma excitation chamber and high frequency power that excites the hydrogen-containing gas supplied to the second plasma excitation chamber.

21. A method of manufacturing a semiconductor device, comprising:

(a) generating a reactive species by plasma-exciting a process gas containing oxygen and hydrogen; and (b) supplying the reactive species to a substrate and oxidizing surfaces of a silicon film and a silicon nitride film formed to be exposed respectively on the substrate, wherein a ratio of a number of hydrogen atoms to a total number of oxygen atoms and hydrogen atoms contained in the process gas is adjusted to 5% or more and 20% or less such that a ratio of a thickness of a second oxide layer formed by oxidizing the surface of the silicon nitride film to a thickness of a first oxide layer formed by oxidizing the surface of the silicon film in (b) becomes a predetermined thickness ratio in a range of 67% or more and 90% or less, and wherein the ratio of the number of hydrogen atoms to the total number of oxygen atoms and hydrogen atoms is adjusted such that the ratio of the number of hydrogen atoms to the total number of oxygen atoms and hydrogen atoms increases as the predetermined thickness ratio decreases.

* * * * *